(12) United States Patent
Lou et al.

(10) Patent No.: US 9,905,354 B2
(45) Date of Patent: Feb. 27, 2018

(54) ELECTRICAL DEVICE WITH INTEGRATED TRANSFORMER AND COMMON MODE CHOKE

(71) Applicant: Cisco Technology, Inc., San Jose, CA (US)

(72) Inventors: Jianquan Lou, Shanghai (CN); Quanhui Sun, Shanghai (CN); Xiaoxia Zhou, Shanghai (CN); Alpesh U. Bhobe, Sunnyvale, CA (US); Jinghan Yu, Shanghai (CN); Yingchun Shu, Shanghai (CN)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/975,217

(22) Filed: Dec. 18, 2015

(65) Prior Publication Data
US 2017/0178783 A1    Jun. 22, 2017

(51) Int. Cl.
| H01F 27/28 | (2006.01) |
| H01R 13/66 | (2006.01) |
| H01F 27/24 | (2006.01) |
| H05K 5/00 | (2006.01) |

(52) U.S. Cl.
CPC ......... *H01F 27/24* (2013.01); *H01F 27/2828* (2013.01); *H05K 5/0026* (2013.01)

(58) Field of Classification Search
CPC .......... H01F 27/24; H01F 27/28; H01F 17/06; H01F 17/062; H05K 5/00

USPC ........ 361/752; 336/212, 192, 170, 214, 184; 439/620.01–620.34
See application file for complete search history.

(56) References Cited

U.S. PATENT DOCUMENTS

| 2,875,378 | A * | 2/1959 | Walsh ..................... H01F 38/10 315/100 |
| 4,613,841 | A | 9/1986 | Roberts |
| 6,317,021 | B1 * | 11/2001 | Jansen ..................... H01F 27/24 336/155 |
| 7,180,950 | B2 | 2/2007 | Engel et al. |
| 8,591,262 | B2 * | 11/2013 | Schaffer .................. H01F 5/003 336/170 |
| 2004/0233015 | A1 * | 11/2004 | Tsai ....................... H03H 7/427 333/181 |
| 2012/0092112 | A1 * | 4/2012 | McClelland .......... H01F 17/062 336/90 |
| 2012/0223797 | A1 * | 9/2012 | Won ...................... H01F 27/325 336/170 |

(Continued)

*Primary Examiner* — Mangtin Lian
(74) *Attorney, Agent, or Firm* — Polsinelli PC

(57) ABSTRACT

An electrical device includes a core structure having a first core section, a second core section, and a third core section. The electrical device further includes a first coil electrically coupled to the first core section and the second core section to form a choke and a primary winding of a transformer. The choke is configured to reduce common mode noise for an electrical signal received by the electrical device, and the primary winding of the transformer is configured to induce a magnetic field on the third core section. The electrical device also includes a second coil electrically coupled to the third core section, which forms a secondary winding of the transformer and receives electromagnetic energy from the magnetic field induced by the primary winding of the transformer.

20 Claims, 11 Drawing Sheets

(56) References Cited

U.S. PATENT DOCUMENTS

2013/0194766 A1\* 8/2013 Chen .................... H01F 27/027
                                                                               361/782
2013/0200975 A1\* 8/2013 Shudarek ................. H01F 3/14
                                                                               336/170

\* cited by examiner

ELECTRICAL DEVICE WITH INTEGRATED TRANSFORMER AND COMMON MODE CHOKE

TECHNICAL FIELD

The present disclosure generally relates to communication systems, and more particularly, to electrical components such as connectors as well as and supporting hardware.

BACKGROUND

Increasingly, electronic device manufactures compete to provide electronic devices having smaller and smaller footprints while also maintaining (or even increasing) performance characteristics (e.g., faster processing, increased memory, etc.). However, certain challenges arise when reducing the footprint of electronic devices. For example, some electronic devices widely employed in modern communication systems include an electrical components or connectors such as "jack". Due to the nature of these modern communication systems (e.g., digital signaling, etc.), these electrical components or jacks often require electronic hardware that occupies a large volume of physical space (e.g., in order to provide proper signal isolation, transformation, filtering, etc.). In turn, such electronic hardware may limit size reductions for the corresponding electrical component.

BRIEF DESCRIPTION OF THE DRAWINGS

The embodiments herein may be better understood by referring to the following description in conjunction with the accompanying drawings in which like reference numerals indicate identical or functionally similar elements. Understanding that these drawings depict only exemplary embodiments of the disclosure and are not therefore to be considered to be limiting of its scope, the principles herein are described and explained with additional specificity and detail through the use of the accompanying drawings in which.

DESCRIPTION OF EXAMPLE EMBODIMENTS

Overview

According to one or more embodiments of the disclosure, an electrical device includes a core structure having a first core section, a second core section, and a third core section. A first coil is electrically coupled to the first core section and the second core section to form a choke and a primary winding of a transformer. The choke is configured to reduce common mode noise for an electrical signal received by the electrical device, and the primary winding of the transformer is configured to induce a magnetic field on the third core section. The electrical device also includes a second coil electrically coupled to the third core section, which forms a secondary winding of the transformer that receives electromagnetic energy from the magnetic field induced by the primary winding of the transformer.

Description

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

As mentioned above, electronic device manufacturers compete to provide smaller electronic devices that maintain (or even increase) performance characteristics. However, physical dimensions of underlying electronic circuit components may prove a limiting factor when reducing the overall footprint of an electronic device. Accordingly, the techniques described herein combine or integrate certain electronic hardware or circuitry in a smaller single integrated component or module. Specifically, the techniques herein provide an integrated transformer and common-mode choke component, which may be used in various types of electronic devices (e.g., connectors, power converters (e.g., DC-DC converters), power supplies, PoE devices, etc.). Such integrated component occupies smaller physical space over separate conventional component configurations and also requires less material to manufacture. Moreover, the integrated transformer and common-mode choke component achieves similar and/or improved signal integrity, noise reduction, and EMI suppression over separate conventional component configurations.

Figure 1:
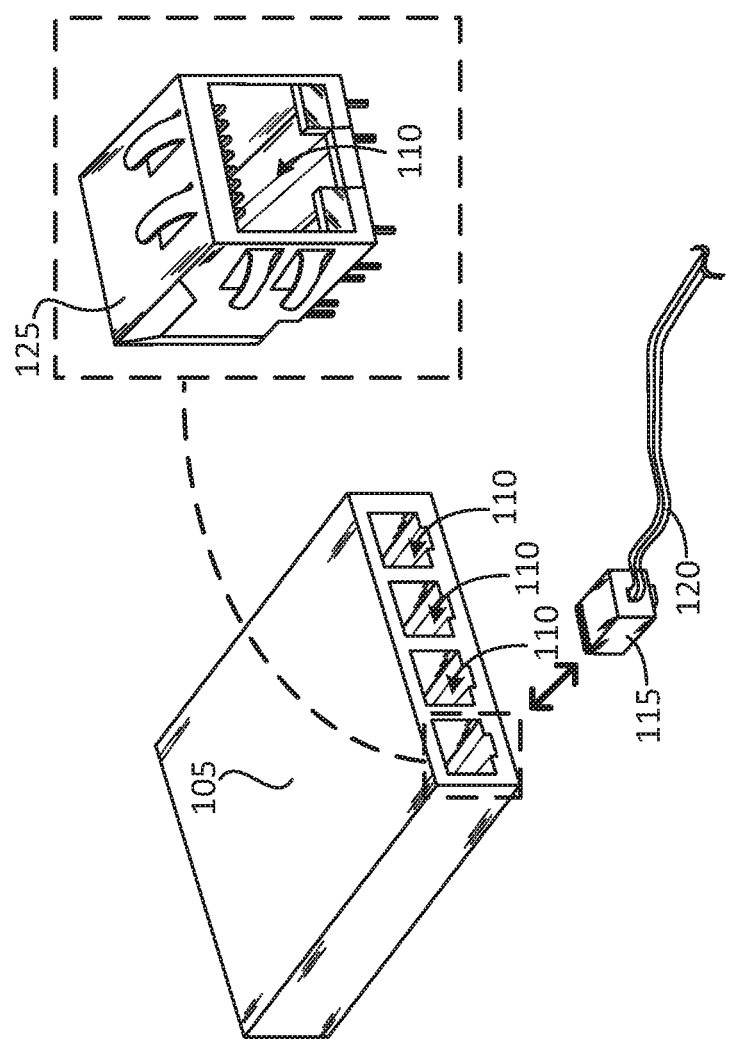
FIG. 1 illustrates a perspective isometric view of an electrical device in accordance with one embodiment of this disclosure.

Referring now to the figures, FIG. 1 generally illustrates a perspective isometric view of an electronic device 100 in accordance with one embodiment of this disclosure. As shown, electronic device 100 includes a housing 105, which devices one or more interfaces or ports 110. Each interface or port 110 is configured to receive a mating connector such as mating connector 115. Notably, mating connector 115 provides an electrical interface for one or more wires 120 (e.g., twisted pair) suitable for transmitting electrical signals in a communication network, as is appreciated by those skilled in the art.

FIG. 1 also illustrates an underlying component that forms one of ports 110—here, a connector 125, which may be an modular RJ45 connector. As discussed above, electronic devices employed in modern communication systems often include electrical components such as an RJ45 connector. RJ45 connectors are commonly used as an input/output interface for signals transmitted between electronic devices—e.g., RJ45 connectors can support 10 BaseT, 100 BaseT, or 1000 BaseT Ethernet standards 802.3X under the Institute for Electrical and Electronics Engineers (IEEE).

As shown, connector 125 includes pins or contacts that electrically interface with pins or contacts on mating connector 115 to form a transmission channel between network devices. Further, as provided herein, connector 125 and/or electronic device 100, may also include electronic components or hardware (e.g., filters, transmitters, receivers, etc.) to meet network standards for noise reduction, EMI suppression, signal isolation, and the like. In some embodiments, these electronic components or hardware may be coupled to a printed circuit board (PCB) (not shown).

Although ports 110 are shown as disposed within housing 105 of electronic device 100, such ports are also commonly disposed or incorporated in other network devices such as a computer, a laptop, a network switch, a router, etc. Further, as discussed in greater detail herein, electrical device 100 incorporates integrated circuitry or integrated components such as an integrated transformer and common-mode choke, to operatively meet signal transmission standards while also reducing an overall size for electronic device 100 (or other devices, as appropriate).

Figure 2:
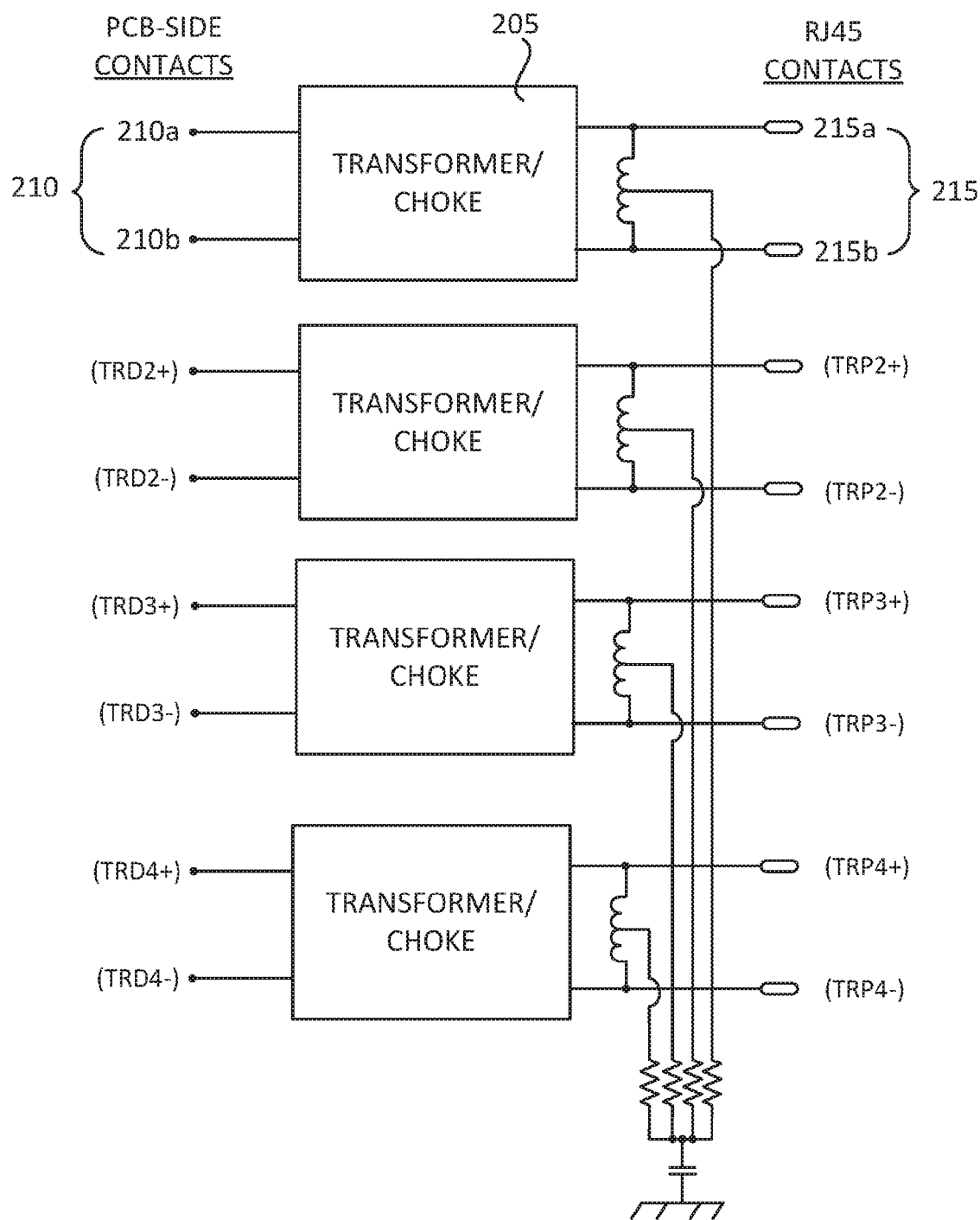
FIG. 2 illustrates a schematic circuit diagram of a portion of the electrical device shown in FIG. 1.

FIG. 2 illustrates a schematic circuit diagram 200 of a portion of electrical device 100 (e.g., connector 125), showing includes an integrated component 205, including a combined transformer and common-mode choke, according to one embodiment of this disclosure.

Circuit diagram 200 also illustrates electrical contacts, including "PCB-side contacts" and "RJ45 contacts", corresponding to transmitter-side contacts (which may be coupled to a printed circuit board (PCB)) and receiver side contacts, respectively. Notably, circuit diagram 200 illustrates a differential signaling configuration for corresponding pairs of contacts. Differential signaling refers to electrical signals communicated as a differential pair—e.g., a pair of PCB-side contacts 210 (including contacts 210a/b) form a transmitter-side differential pair, and a pair of corresponding RJ45 contacts 215 (including contacts 215a/b) are paired to form a receiver-side differential pair.

Further, circuit diagram 200 illustrates an integrated component 205, which combines a transformer and an a common-mode choke, electrically coupled between transmitter-side contact pairs and corresponding receiver-side contact pairs. Integrated component 205 operates as a transformer and a common mode choke to reduce noise, suppress electromagnetic interference (EMI), provide signal isolation, and the like, for electrical signals between transmitter-side and receiver-side contacts.

As noted above, electronic devices employed in modern communication systems often include electrical devices such as connectors that include large (e.g., bulky) electronic hardware in order to meet various network standards for signal isolation, filtering, noise, etc. Further, certain electronic components, e.g., transformers, inductors, chokes, etc., are typically implemented as separate components or circuits, which occupy a large volume of space (e.g., due to respective magnetic cores, coils, etc.). Accordingly, the techniques and devices disclosed herein provide an integrated component that combines a transformer and a choke using a shared core.

Figure 3:
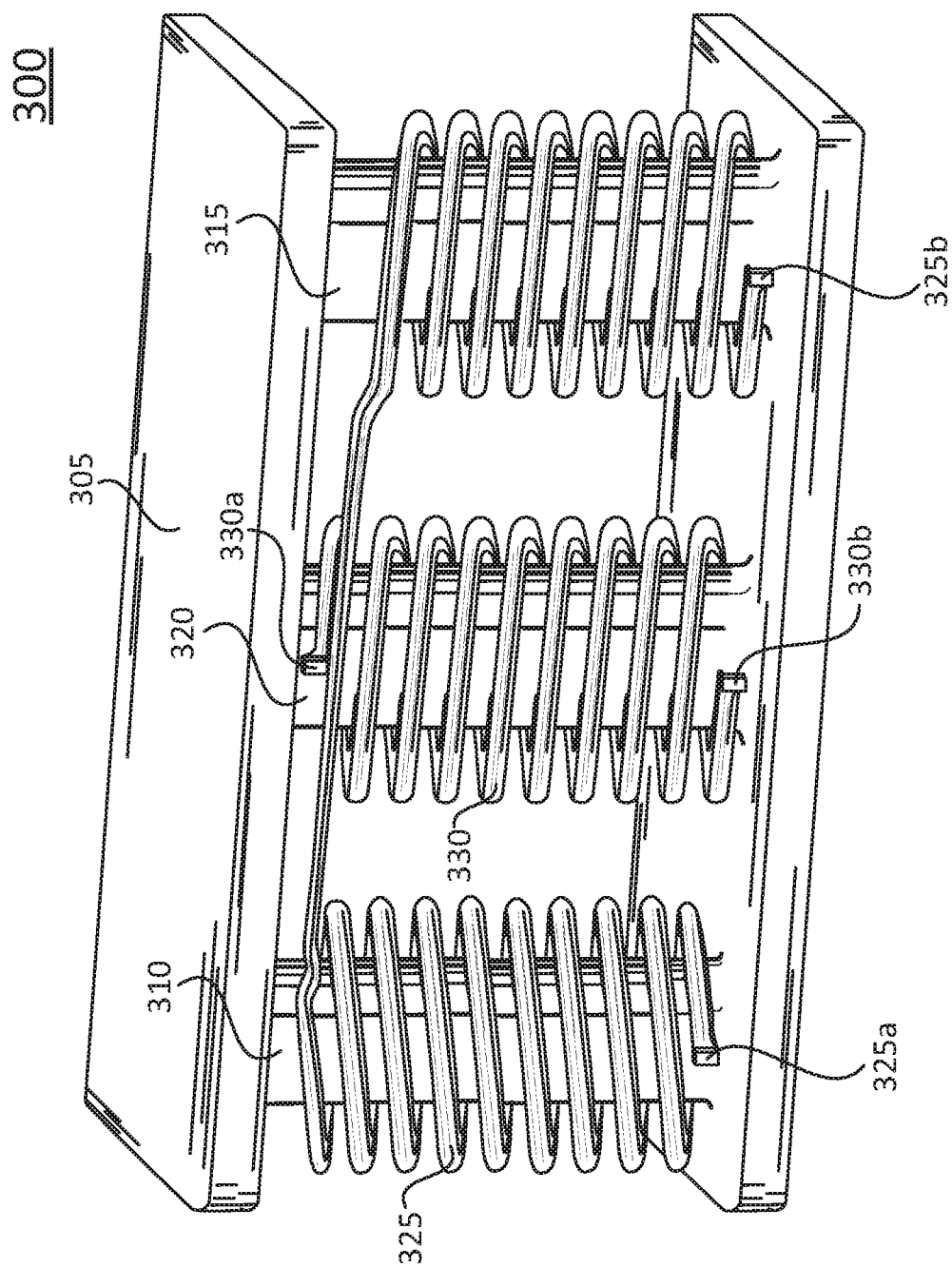
FIG. 3 illustrates a perspective isometric view of an integrated component shown in FIG. 2, showing a combined transformer and a choke with a shared core.
Figure 4:
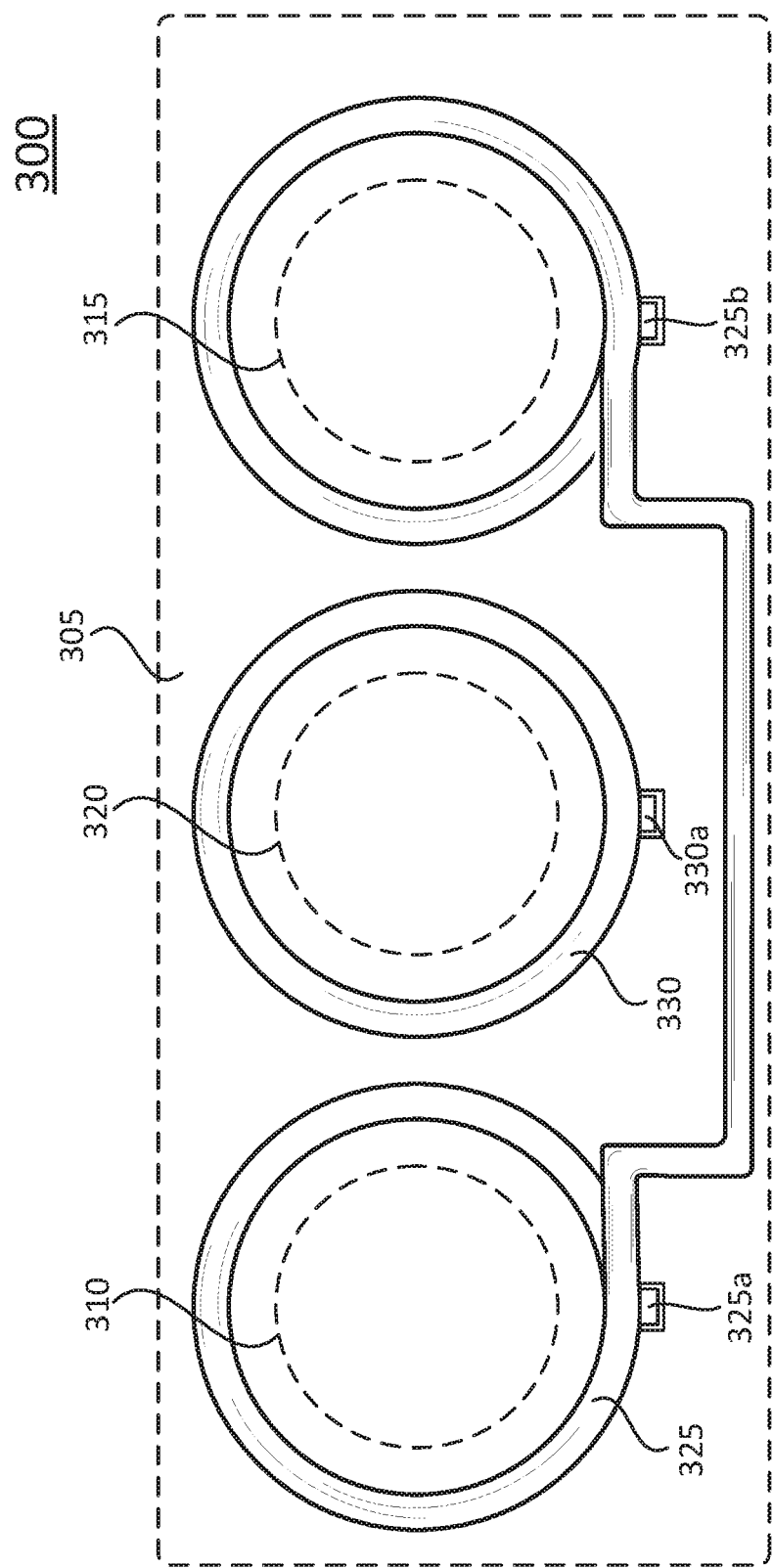
FIG. 4 illustrates a top plan view of the integrated component shown in FIG. 3.

For example, FIGS. 3 and 4 collectively illustrate an integrated component 300 (e.g., which may be used as integrated component 205), showing a combined transformer/choke using a shared core 305. In particular, FIG. 3 illustrates a perspective isometric view of integrated component 300, and FIG. 4 illustrates a top plan view of integrated component 300.

As shown, integrated component 300 has a shared core 305 that includes a configuration of cylindrical core sections—e.g., a core section 310, a core section 315, and a core section 320, with core section 320 disposed between core section 310 and core section 315. Shared core 305 may include a high permeability material, such as a ferromagnetic or a ferromagnetic material, which may confine and/or guide magnetic flux (and magnetic fields) corresponding to electrical signals (e.g., electrical current) received/transmitted by integrated component 300.

Integrated component 300 also includes one or more wires wrapped or coiled about respective core sections. For example, integrated component 300 can include wire(s) formed from any suitable conductor that preferably includes a thin insulation layer (e.g., a magnetic wire/enameled wire/etc.). Here, integrated component 300 includes a wire 325 coupled to both core section 310 and core section 315, and a wire 330 coupled to core section 320. Significantly, portions of wire 325 are wrapped about core section 310 and core section 315 to (collectively) form a first coil, which operates as a common mode choke (e.g., passing differential signals but filtering common-mode signals). In addition, the first coil also forms a winding (e.g., a primary winding) of a transformer.

Wire 330 forms a second coil about core section 320 and provides a second winding (e.g., a secondary winding) of the transformer. In some embodiments, the number of turns for the primary and secondary windings of the transformer can have a 1:1 ratio. In this manner, integrated component 300 can isolate differential signals without transforming voltages/currents. In other embodiments, the number of turns in the primary and secondary windings of the transformer can be formed to step-up or step-down voltages/currents of signals received by integrated component 300.

Wire 325 and wire 330 terminate at respective electrical contacts, with contacts 325a/b corresponding to wire 325 and contacts 330a/b corresponding to wire 330. Electrical contacts 325a/b and 330a/b facilitate electrical signaling or communications (e.g., input/output) for integrated component 300.

Operatively, integrated component 300 can receive electrical signals (e.g., differential, common-mode, etc.) from contacts 325a/b of wire 325. Depending on signal type, wire 325 can perform common mode choke filtering (e.g., core section 310 and core section 315 cooperate to create a high impedance magnetic field), and/or wire 325 can perform signal isolation/transformation (e.g., core section 310 and core section 315 cooperate induce a magnetic field on wire 330 (e.g., core section 320). For example, common mode and signal isolation/transformation operations are shown in FIGS. 5-7, discussed below.

Figure 5:
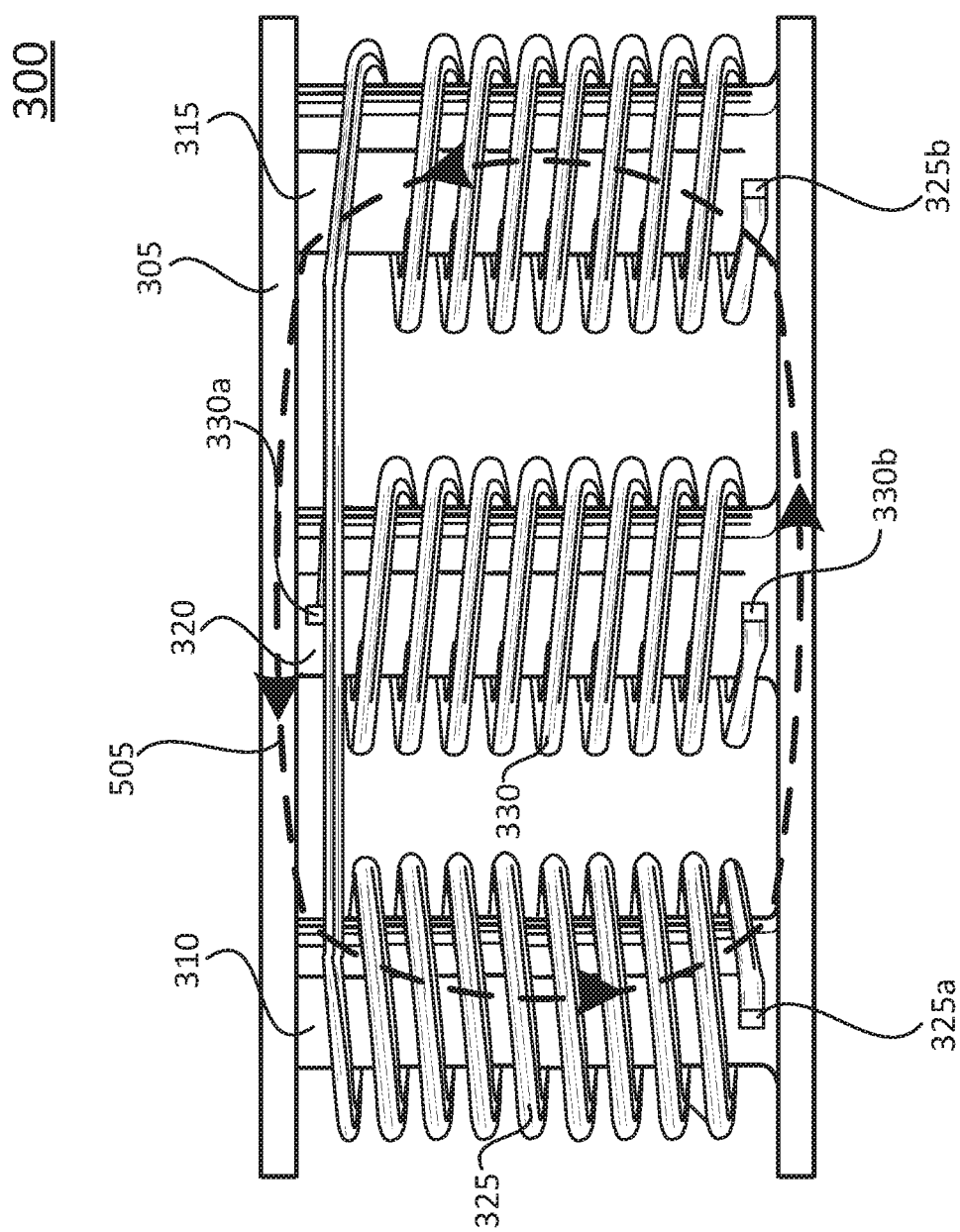
FIG. 5 illustrates a front-side elevation view of the integrated component shown in FIG. 3, showing common mode choke operations.

FIG. 5 illustrates a front-side elevation view of integrated component 300 showing common mode choke operations. As shown, integrated component 300 receives a signal that includes a common mode component at electrical contacts 325a/b. The signal flows through wire 325, including core section 310 and core section 315, and generates a magnetic field in shared core 305, indicated by a magnetic flux line 505. The magnetic field is guided by shared core 305 and forms a high impedance field that attenuates/filters common-mode noise from the signal. For example, electrical contacts 325*a/b* can receive a differential signal that includes a common-mode noise component (e.g., due to factors such as EMI, switching noise, and the like). The common-mode noise component of the differential signal flows in a same direction through windings of wire 325 (including portions coiled about core section 310 and core section 315) and generates an additive, in-phase, magnetic field in shared core 305 that presents a high impedance to common-mode currents. In contrast, the magnetic field in shared core 305 presents very low (near zero) impedance to differential signals because such differential signals generate equal but opposite magnetic flux/fields that effectively cancel out. In this fashion, integrated component 300 operates as a common-mode choke that filter common-mode signal noise while passing an underlying differential signal.

Figure 6:
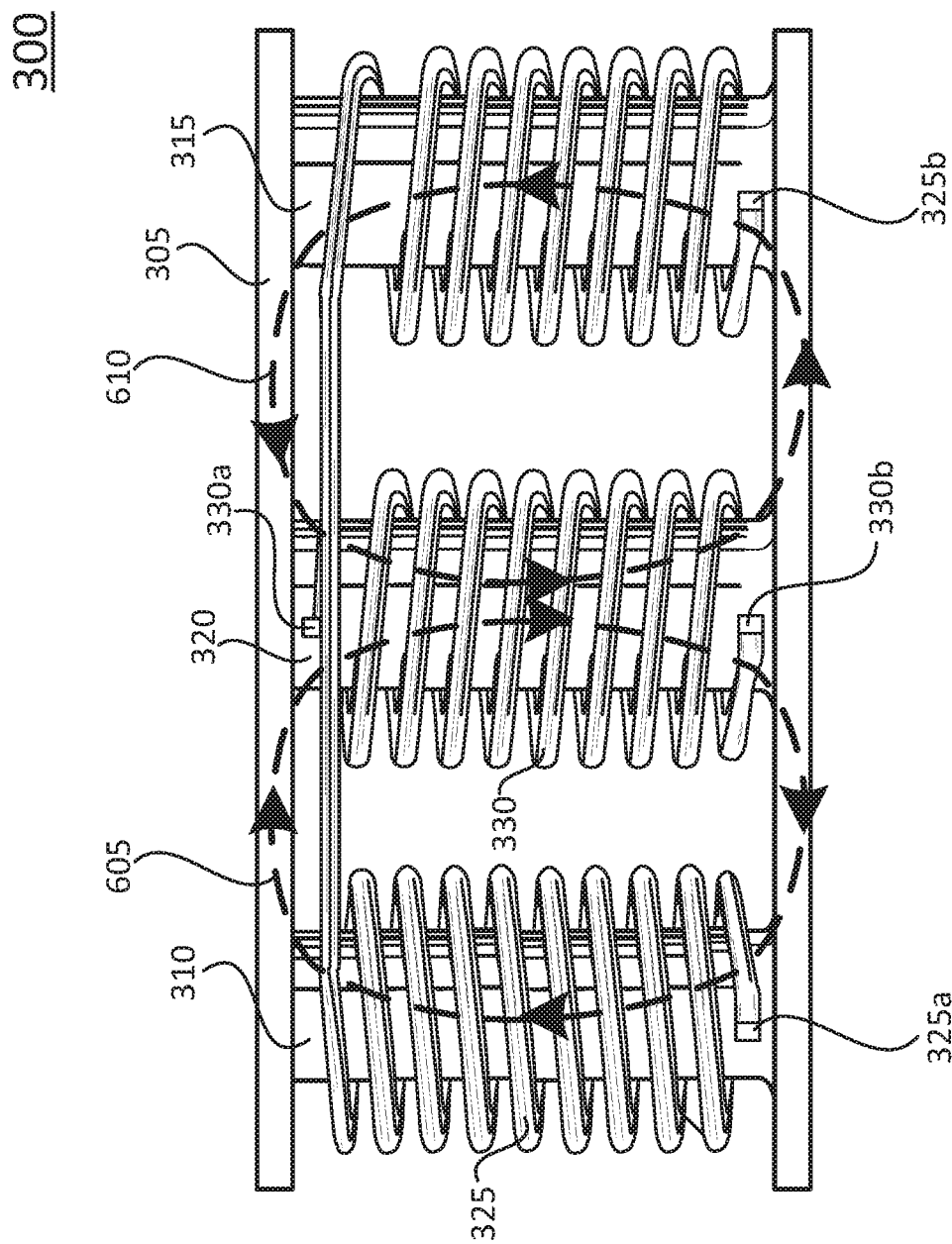
FIG. 6 illustrates a front-side elevation view of the integrated component shown in FIG. 3, showing transformer operations.

FIG. 6 illustrates a front-side elevation view of integrated component 300 showing transformer operations. As shown, integrated component 300 receives an electrical signal at electrical contacts 325*a/b*. For example, the electrical signal may include a differential signal and/or a signal having differential components. The electrical signal flows through wire 325, including core section 310 and core section 315, which causes wire 325 to generate two magnetic fields indicated by magnetic flux lines 605 and 610. Notably, shared core 305 confines and guides these magnetic fields. Further, as shown, magnetic flux lines 605 and 610 (and corresponding magnetic fields) flow in opposite directions from due to a direction of wrapping or coiling portions of wire 325 about core section 310 and core section 315. In addition, the portions of wire 325 coiled about core section 310 and core section 315 collectively form a primary winding of a transformer that induces a magnetic field about a secondary winding—here, wire 330 coiled about core section 320. Operatively, the magnetic fields produced by a differential signal flowing through wire 325, including core section 310 and core section 315, present a low impedance when functioning as a common-mode choke, thus allowing differential signals to pass un-attenuated. Further, as shown, the magnetic fields generated by wire 325, including core section 310 and core section 315, induce respective magnetic fields on wire 330 to electromagnetically transfer the differential signal from the primary winding (i.e., wire 325) to the secondary winding (i.e., wire 330) of the transformer. In this fashion, referring to FIGS. 5 and 6, integrated component 300 may filter common mode signal sand isolate differential signals and further output a resultant filtered/isolated signal at electrical contacts 330*a/b* of wire 330.

Figure 7:
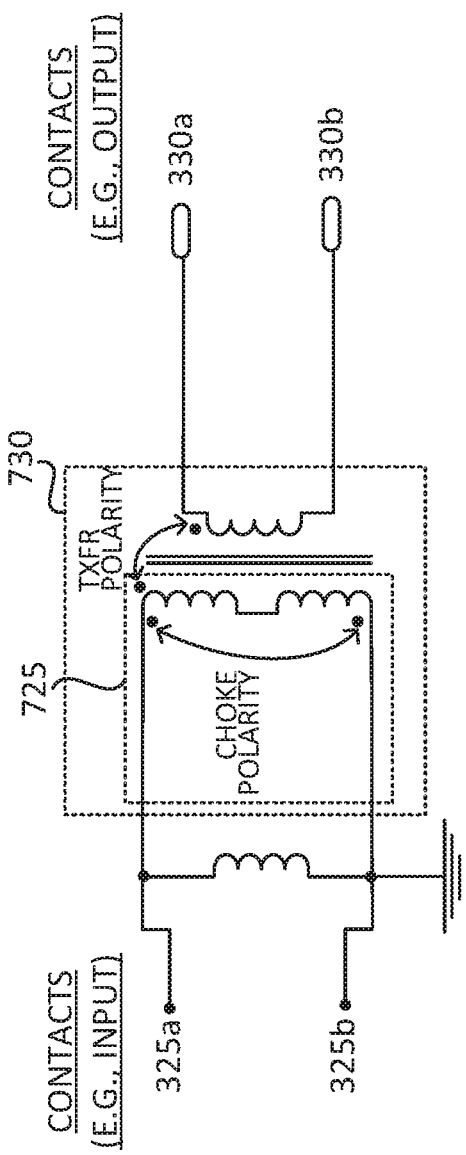
FIG. 7 illustrates a schematic circuit diagram of the integrated component shown in FIG. 3, showing electrical paths for signal isolation and common mode choke filtering.

FIG. 7 illustrates a schematic circuit diagram 700 for integrated component 300, showing electrical paths for signal isolation and common mode choke filtering. As shown, circuit diagram 700 includes contacts for inputs 325*a*/325*b* and outputs 330*a*/330*b*, as well as integrated common-mode choke (e.g., circuit component 725) and transformer (e.g., circuit component 730). Operatively, circuit component 725 forms a common mode choke as well as a primary winding of a transformer—here, circuit component 730. For example, referring back to FIG. 3, circuit component 725 may include wire 325 coiled about core sections 310 and 315 of integrated component 300. Further, circuit component 730 forms a secondary winding of the transformer and may include, for example, wire 330 coiled about core section 320 of integrated component 300. As shown, circuit diagram 700 highlights integrated hardware components that provide bidirectional signal isolation, transformation, filtering, and the like.

Figure 8:
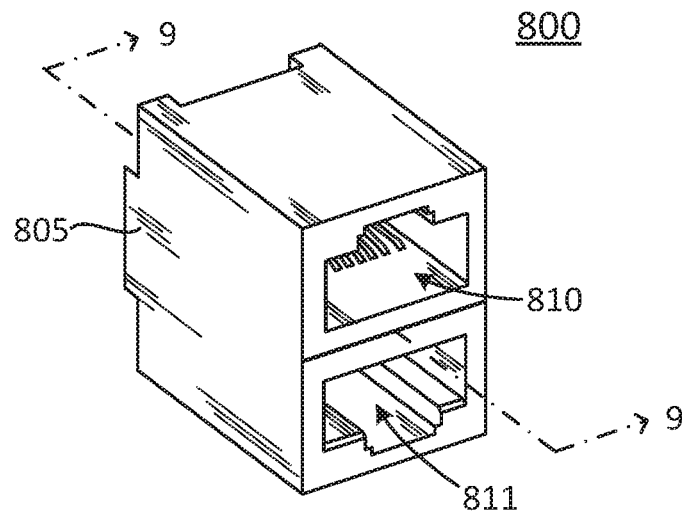
FIG. 8 illustrates a perspective isometric view of an electrical device in accordance another embodiment of this disclosure.

FIG. 8 illustrates a perspective isometric view of an electronic device 800 in accordance with another embodiment of the present disclosure. Electronic device 800 includes a housing 805 that defines multiple ports configured to receive a mating connector. Here, electronic device 800 may be an RJ 45 connector having a port 810, and a port 811. Port 811 is positioned above port 810 but in opposite orientation relative to port 810 (e.g., upside down) to reduce an overall profile of electronic device 800. Ports 810 and 811 may include hardware that, for example, operates to couple signals between respective mating connectors/wires, split signals into multiple signals, or support other network functions as is appreciated by those skilled in the art.

Figure 9:
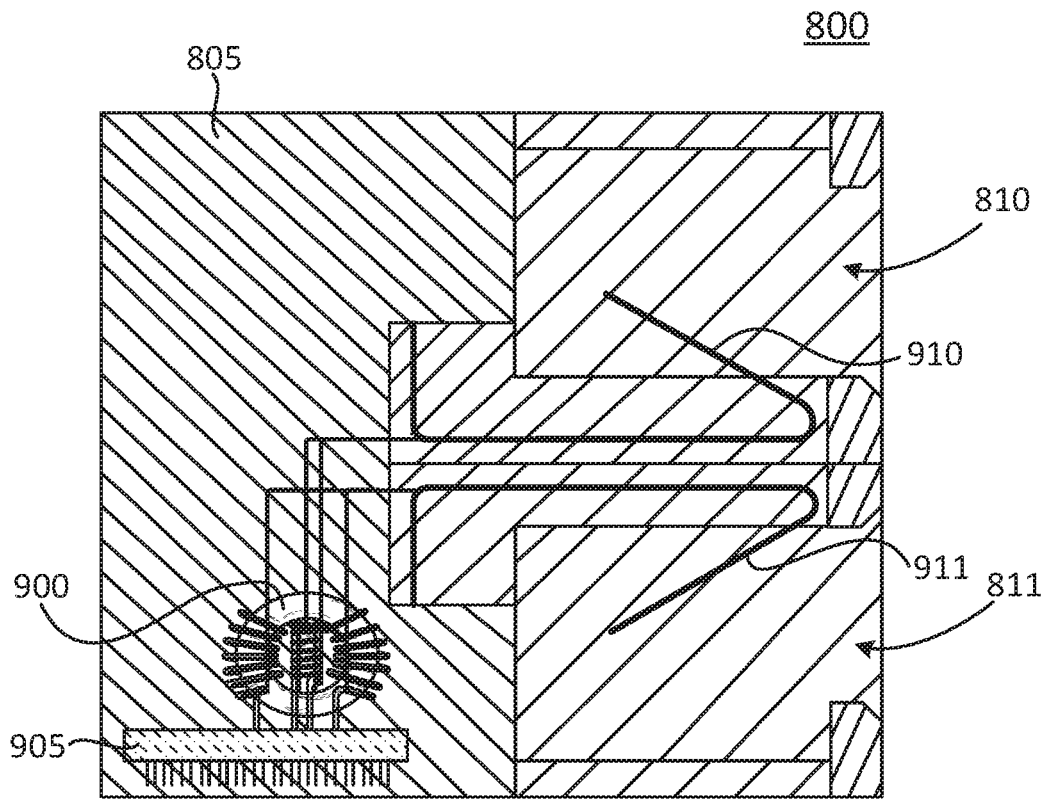
FIG. 9 illustrates a cut-section view of the electrical device shown in FIG. 8, viewed at cut-lines 9-9 and showing an integrated component.

FIG. 9 illustrates a cross-section view of electronic device 800, viewed at cut-line 9-9 in FIG. 8. As shown, ports 810 and 811 include respective contacts 910 and 911. Contacts 910 and 911 electrically interface with corresponding pins of a mating connector, e.g., when mating connectors are received in ports 810 and 811. In addition, contacts 910 and 911 further interface with a printed circuit board (PCB) 905. Operatively, PCB 905 provides an electrical interface between contacts 910 and 911 and electrical hardware of electronic device 800. For example, as discussed above, electronic device 800 may include hardware that facilitates communications, signal switching, conditioning, filtering, isolation. Such hardware can include an integrated component 900, which (similar to integrated component 300) combines a transformer and a choke (here, a common mode choke) using a shared core.

Figure 10:
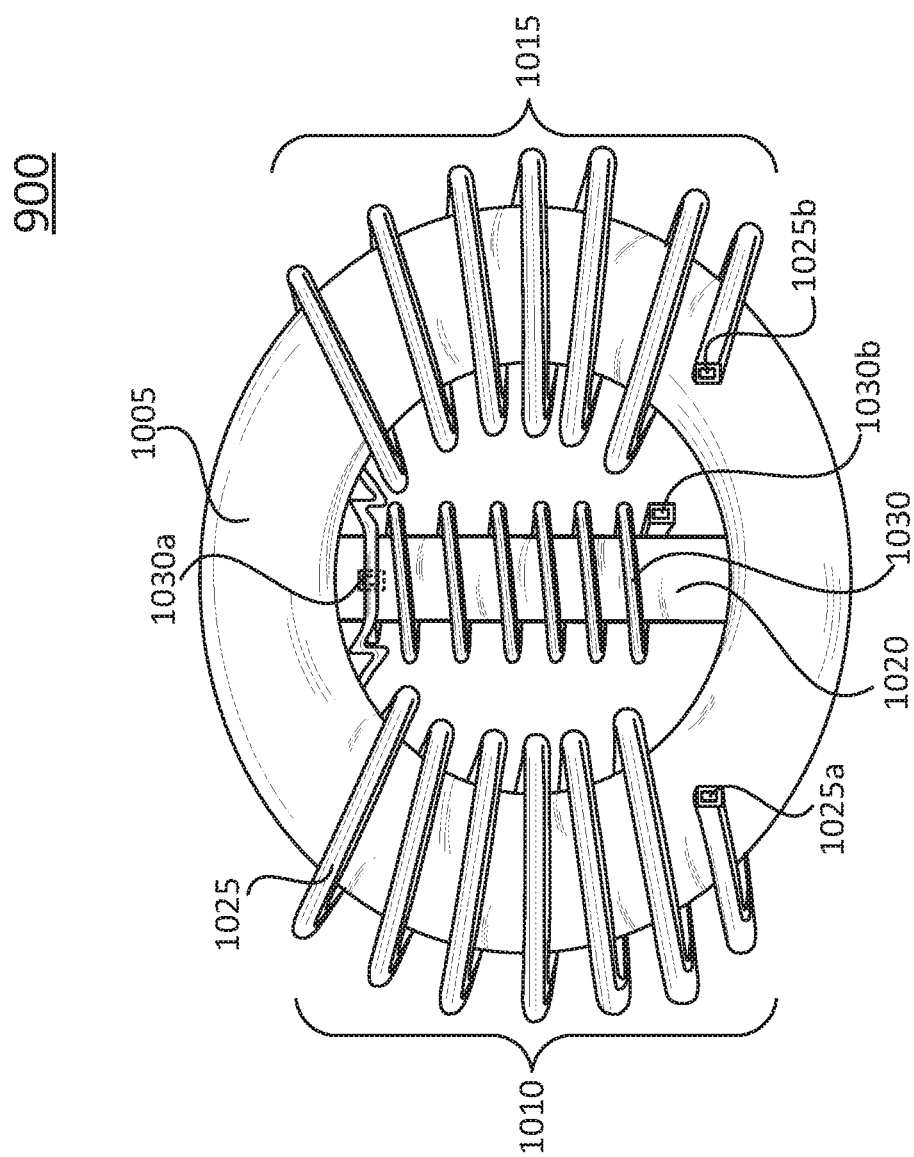
FIG. 10 illustrates a side elevation view of the integrated component shown in FIG. 9, including a combined transformer and a choke with a shared core.

FIG. 10 illustrates a front-side elevation view of integrated component 900. As shown, integrated component 900 includes a core 1005 (e.g., a shared or common core), including a core section 1010, a core section 1015, and a core section 1020. Core section 1010 and core section 1015 cooperate to form a toroidal body defining a cavity which core section 1020 is substantially disposed within. Core section 1020 particularly forms a cylinder disposed substantially inside the cavity defined by the toroidal body. Core section 1020 further electrically couples with core section 1010 and core section 1015.

Integrated component 900 also includes a wire 1025 coupled to core section 1010 and core section 1015. Significantly, portions of wire 1025 are wrapped about core section 1010 and core section 1015 to (collectively) form a first coil, which operates as a common mode choke (e.g., passing differential signals but filtering common-mode signals). In addition, this first coil also forms a winding (e.g., a primary winding) of a transformer. Wire 1030 forms a second coil about core section 1020 and provides a second winding (e.g., a secondary winding) of the transformer. Preferably, wire 1025 and/or wire 1030 include electrical conducting material with an insulation layer (e.g., an enamel wire, etc.). Further (similar to integrated component 300), windings of the transformer formed by wire 1030 and wire 1025 may include particular ratios, depending on desired application (e.g., isolation, transformation, etc.).

Wire 1025 and wire 1030 terminate at respective electrical contacts, with contacts 1025*a/b* corresponding to wire 1025 and contacts 1030*a/b* corresponding to wire 1030. Electrical contacts 1025*a/b* and 1030*a/b* facilitate electrical signaling or communications (e.g., input/output) for integrated component 900.

Operatively, integrated component 900 (similar to integrated component 300) receives electrical signals (e.g., differential, common-mode, etc.) from contacts 1025*a/b* of wire 1025. Further, depending on signal type, wire 1025 can perform common mode choke filtering (e.g., core section 1010 and core section 1015 cooperate to create a high impedance magnetic field), and/or wire 1025 can perform signal isolation/transformation (e.g., core section 1010 and core section 1015 cooperate induce a magnetic field on wire 1030 (e.g., core section 1020). In this fashion, core 1005 (including core sections 1010, 1015 and 1020) can confine and/or guide magnetic flux from an induced electrical current generated by signal inputs to integrated component 900. Notably, core 1005 may include a high permeability material, such as a ferromagnetic or a ferromagnetic material.

Figure 11:
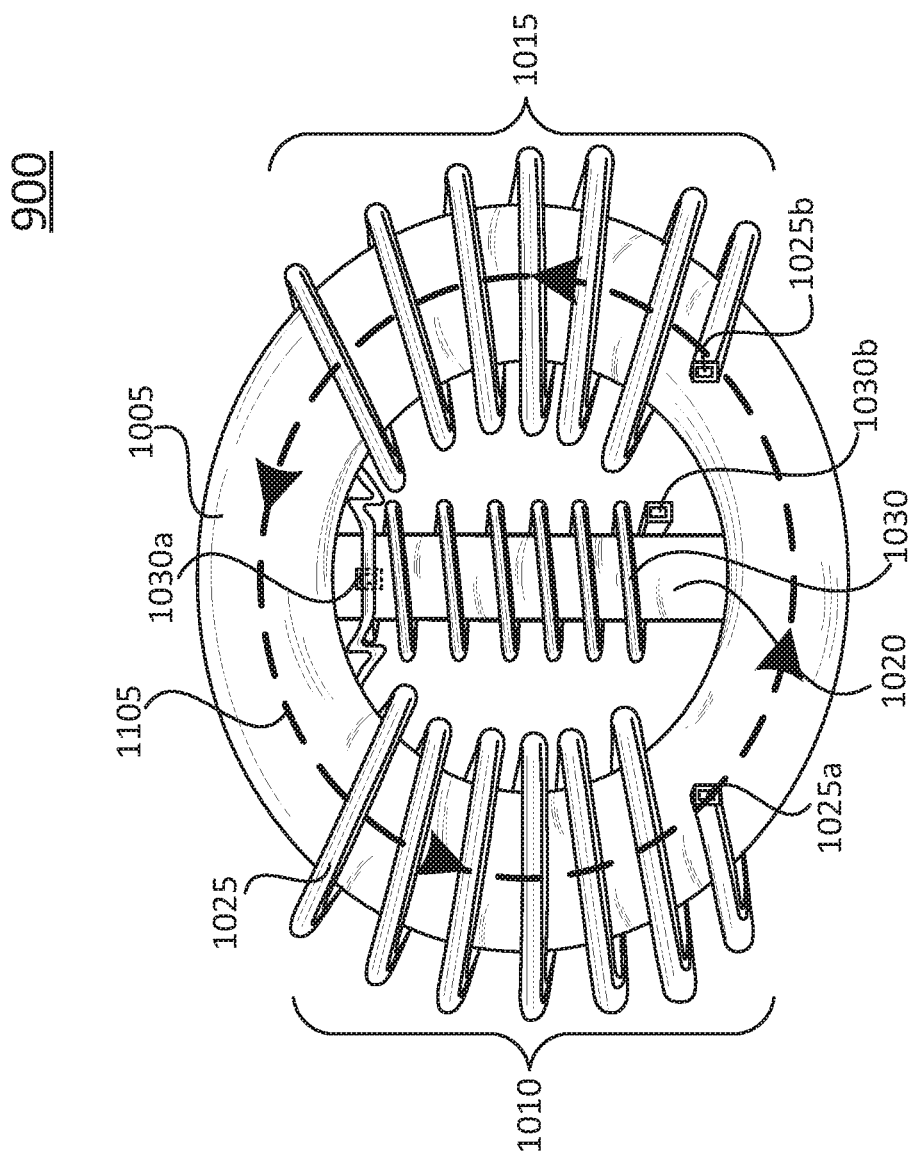
FIG. 11 illustrates a front-side elevation view of the integrated component shown in FIG. 9, showing common mode choke operations.

FIG. 11 illustrates a front-side elevation view of integrated component 900 showing common mode choke operations. As shown, integrated component 900 receives a signal that includes a common mode component at electrical contacts 1025*a/b*. The signal flows through wire 1025, including core section 1010 and core section 1015, and generates a magnetic field in core 1005 (e.g., indicated by a magnetic flux line 1105). The magnetic field is guided by core 1005 and forms a high impedance field that attenuates/filters common-mode noise from the signal. For example, electrical contacts 1025*a/b* can receive a differential signal that includes a common-mode noise component (e.g., due to factors such as EMI, switching noise, and the like). The common-mode noise component of the differential signal flows in a same direction through windings of wire 1025 (including portions coiled about core section 1010 and core section 1015) and generates an additive, in-phase, magnetic field in core 1005 that presents a high impedance to common-mode currents. In contrast, the magnetic field in core 1005 presents very low (near zero) impedance to differential signals because such differential signals generate equal but opposite magnetic flux/fields that effectively cancel out. In this fashion, integrated component 900 operates as a common-mode choke that filter common-mode signal noise while passing an underlying differential signal.

Figure 12:
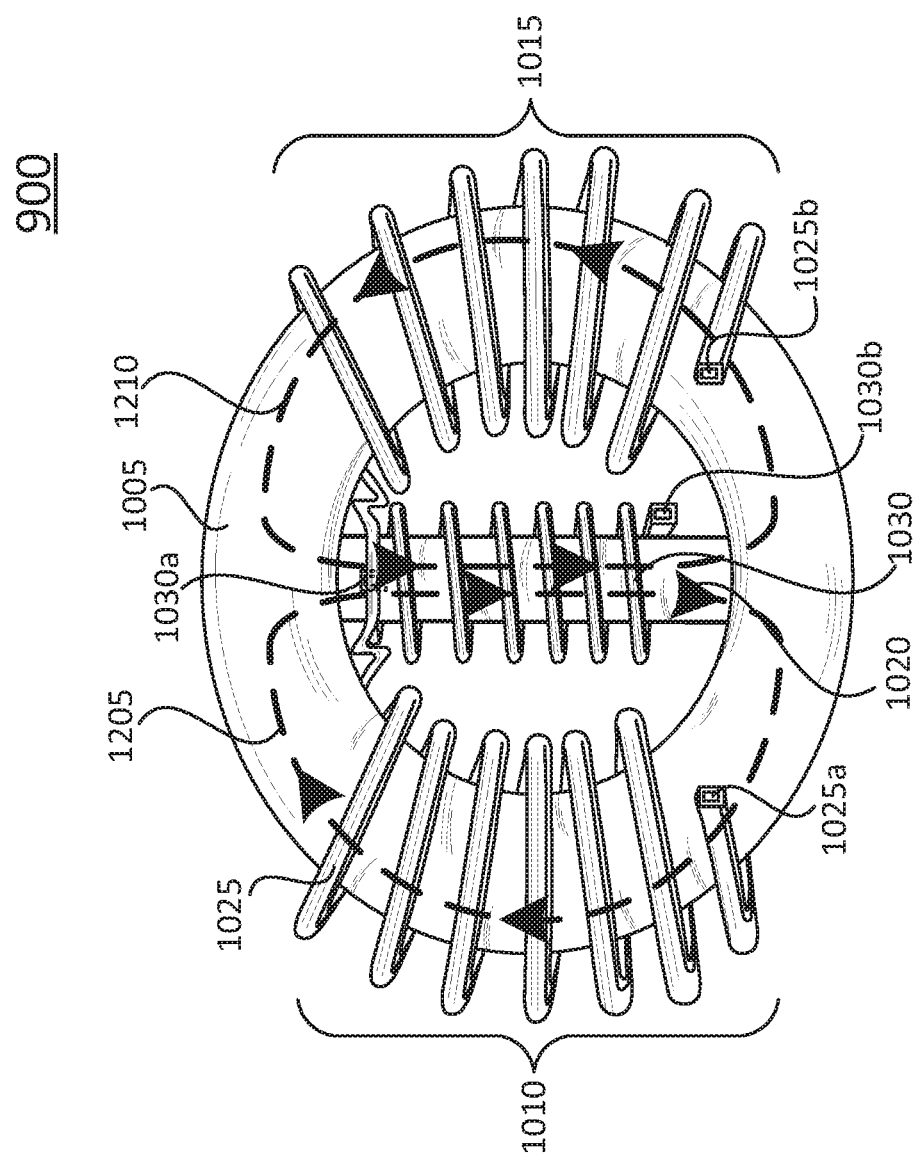
FIG. 12 illustrates a front-side elevation view of the integrated component shown in FIG. 9, showing transformer operations.

FIG. 12 illustrates a front-side elevation view of integrated component 900 showing transformer operations. As shown, integrated component 900 receives an electrical signal at electrical contacts 1025*a/b*. For example, the electrical signal may include a differential signal and/or a signal having differential components. The electrical signal flows through wire 1025, including core section 1010 and core section 1015, which causes wire 1025 to generate two magnetic fields indicated by magnetic flux lines 1205 and 1210. Notably, shared core 1005 confines and guides these magnetic fields. Further, as shown, magnetic flux lines 1205 and 1210 (and corresponding magnetic fields) flow in opposite directions from due to a direction of wrapping or coiling portions of wire 1025 about core section 1010 and core section 1015. In addition, the portions of wire 1025 coiled about core section 1010 and core section 1015 collectively form a primary winding of a transformer that induces a magnetic field about a secondary winding—here, wire 1030 coiled about core section 1020. Operatively, the magnetic fields produced by a differential signal flowing through wire 1025, including core section 1010 and core section 1015, present a low impedance when functioning as a common-mode choke, thus allowing differential signals to pass un-attenuated. Further, as shown, the magnetic fields generated by wire 1025, including core section 1010 and core section 1015, induce respective magnetic fields on wire 1030 to electromagnetically transfer the differential signal from the primary winding (i.e., wire 1025) to the secondary winding (i.e., wire 1030) of the transformer. In this fashion, referring to FIGS. 11 and 12, integrated component 900 can filter and isolate differential signals and further output a resultant filtered/isolated signal at electrical contacts 1030*a/b* of wire 1030.

The devices and techniques described herein, therefore, provide an integrated component that combines a transformer and a common-mode choke using a common core. The integrated component filters out common-mode noise from signals (e.g., common mode-choke) while also passes un-attenuated differential signals (electromagnetic induction/transformation). The integrated component further has similar or better signal integrity and electromagnetic interference performance when compared to conventional separate component designs. Further, such the integrated components disclosed herein occupy less volume, require less material, and have less mass/weight over conventional separate component designs.

While there have been shown and described illustrative embodiments that provide an integrated component that operates as a transformer and common-mode choke, it is to be understood that various other adaptations and modifications may be made within the spirit and scope of the embodiments herein. For example, the embodiments have been shown and described herein with relation to particular connectors, such as RJ45 connectors. However, it should be readily appreciated that the integrated components are suitable for any number of other electronic devices and/or applications, such as power converters (e.g., DC-DC converters), power supplies, PoE devices, or any other device that utilizes transformer-choke magnetics. Furthermore, although the specific configurations of the integrated components are shown in particular sizes, shapes, windings, number of cores, and the like, such specific configurations are for purposes of illustration, not limitation. The embodiments in their broader sense are not as limited, and may, in fact, be adapted for various other configurations.

The invention claimed is:

1. An electrical device, comprising:
a core structure having at least a first core section, a second core section, and a third core section;
a common mode choke, the common mode choke comprising a first wire electrically coupled to the first core section and the second core section such that the common mode choke receives an electrical signal and outputs a choke signal with reduced common mode noise;
a transformer with a primary winding and a secondary winding, wherein the primary winding comprises the common mode choke and the secondary winding comprises a second wire electrically coupled to the third core section, such that the secondary winding receives electromagnetic energy from the magnetic field induced by the choke signal from the common mode choke; and
a printed circuit board configured to provide an electrical interface between the core structure and one or more electrical contacts of a mating connector,
wherein,
terminals of the primary winding are directly connected to the printed circuit board,
the first core section and the second core section form a toroidal body that defines a cavity, and
the third core section forms a cylinder disposed substantially inside the cavity of the toroidal body.

2. The electrical device of claim 1,
wherein,
the printed circuit board is disposed in a housing defining a port configured to receive the mating connector having the one or more electrical contacts.

3. The electrical device of claim 1, wherein the core structure includes a ferromagnetic material.

4. The electrical device of claim 1, wherein a portion of the first wire forms a coil wrapped around the first core section and a coil wrapped around the second core section, and wherein a portion of the second wire forms a coil wrapped around the third core section.

5. The electrical device of claim 1, wherein the first wire includes a pair of electrical contacts configured to receive the electrical signal, and wherein the second wire includes a pair of electrical contacts for an output signal when the primary winding of the transformer induce the magnetic field on the third core section.

6. The electrical device of claim 1, wherein the first wire filters common mode noise from the electrical signal and induces the magnetic field on the third core section.

7. The electrical device of claim 1, further comprising:
a housing defining at least two ports, each port configured to receive the mating connector having the one or more electrical contacts,
wherein,
the electrical interface couples the core structure to the one or more electrical contacts for the mating connector received by each port.

8. The electrical device of claim 1, wherein each of the first core section and the second core section are cylindrical.

9. The electrical device of claim 1, wherein the cylinder is disposed entirely inside the cavity of the toroidal body.

10. The electrical device of claim 1, wherein the electrical device is an RJ-45 connector.

11. An electronic device, comprising:
a housing defining at least one port configured to receive a mating connector, each port includes one or more electrical contacts that interface with portions of the mating connector; and
an integrated component that electrically interfaces with the one or more electrical contacts, the integrated component includes:
a core structure having at least a first core section, a second core section, a third core section;
a common mode choke comprising a first wire electrically coupled to the first core section and the second core section, the common mode choke also forming a primary winding of a transformer;
a second wire electrically coupled to the third core section forming a secondary winding of the transformer, such that the secondary winding receives electromagnetic energy from the magnetic field induced by the common mode choke; and
a printed circuit board configured to provide an electrical interface between the core structure and the one or more electrical contacts of the mating connector,
wherein,
terminals of the primary winding are directly connected to the printed circuit board,
the first core section and second core section of the integrated component form a toroid, and
the third core section forms a cylinder substantially disposed in an interior of the toroid.

12. The electronic device of claim 11, further comprising:
the printed circuit board that forms an interface between the one or more electrical contacts and the integrated component.

13. The electronic device of claim 11, wherein the core structure of the integrated component includes a ferromagnetic material.

14. The electronic device of claim 11, wherein a portion of the first wire forms a coil wrapped around the first core section and a coil wrapped around the second core section, and wherein a portion of the second wire forms a coil wrapped around the third core section.

15. The electronic device of claim 14, wherein the coil wrapped around the first core section and the coil wrapped around the second core section cooperate to filter common mode noise from an electrical signal and induce a magnetic field on the coil wrapped around the third core section.

16. The electronic device of claim 11, wherein the first wire includes a pair of electrical contacts configured to receive an electrical signal, wherein the second wire includes a pair of electrical contacts for an output signal when the primary winding of the transformer induce a magnetic field on the third core section.

17. The electronic device of claim 11, wherein the cylinder is entirely disposed in the interior of the toroid.

18. The electronic device of claim 11, wherein a magnetic field directed by the first core section and the second core section filters common mode noise from an electrical signal, and wherein the magnetic field directed by the first core section and the second core section induces a corresponding magnetic field on the third core section to isolate the electrical signal.

19. The electronic device of claim 11, wherein the integrated component comprises a ferromagnetic material.

20. The electronic device of claim 11, wherein the electronic device is an RJ-45 connector.

* * * * *